(12) United States Patent
Yamazaki

(10) Patent No.: US 6,180,991 B1
(45) Date of Patent: *Jan. 30, 2001

(54) SEMICONDUCTOR HAVING LOW CONCENTRATION OF PHOSPHOROUS

(75) Inventor: Shunpei Yamazaki, Tokyo (JP)

(73) Assignee: Semiconductor Energy Laboratory Co., Ltd., Kanagawa-ken (JP)

(*) Notice: Under 35 U.S.C. 154(b), the term of this patent shall be extended for 0 days.

This patent is subject to a terminal disclaimer.

(21) Appl. No.: 08/426,235

(22) Filed: Apr. 21, 1995

Related U.S. Application Data

(62) Division of application No. 08/350,169, filed on Nov. 30, 1994, now abandoned, which is a continuation of application No. 07/748,421, filed on Aug. 22, 1991, now abandoned, which is a division of application No. 07/443,015, filed on Nov. 29, 1989, now Pat. No. 5,077,223, which is a continuation of application No. 06/785,586, filed on Oct. 8, 1985, now abandoned, which is a division of application No. 06/564,213, filed on Dec. 22, 1983, now Pat. No. 4,581,476, which is a continuation-in-part of application No. 06/525,459, filed on Aug. 22, 1983, now Pat. No. 4,591,892.

(30) Foreign Application Priority Data

Dec. 23, 1982 (JP) .................................................. 57-228158

(51) Int. Cl.⁷ .............................. H01L 29/78; H01L 33/00
(52) U.S. Cl. ............................................. 257/458; 257/56
(58) Field of Search ....................................... 257/56, 458

(56) References Cited

U.S. PATENT DOCUMENTS

| | | |
|---|---|---|
| 2,882,243 | 4/1959 | Milton . |
| 2,971,607 | 2/1961 | Caswell . |
| 3,155,621 | 11/1964 | Cowlard et al. . |
| 3,462,422 | 8/1969 | Deal . |

(List continued on next page.)

FOREIGN PATENT DOCUMENTS

| | | | |
|---|---|---|---|
| 0180781 | 5/1986 | (EP) | ............................. 136/258 AM |
| 2130008 | 9/1985 | (GB) . | |
| 51-1389 | 1/1976 | (JP) . | |
| 54-136274 | 10/1979 | (JP) . | |
| 54-158190 | 12/1979 | (JP) . | |
| 55-11329 | 1/1980 | (JP) . | |
| 55-13939 | 1/1980 | (JP) . | |
| 55-29154 | * 3/1980 | (JP) . | |
| 53-152887 | 6/1980 | (JP) . | |
| 55-78524 | 6/1980 | (JP) . | |
| 56-135968 | 10/1981 | (JP) . | |
| 57-40940 | 3/1982 | (JP) . | |
| 57-146561 | 8/1982 | (JP) . | |
| 57-146562 | 8/1982 | (JP) . | |
| 57-182546 | 10/1982 | (JP) . | |
| 57-187972 | 11/1982 | (JP) . | |
| 58-28873 | 2/1983 | (JP) . | |
| 58-92217 | 6/1983 | (JP) . | |

(List continued on next page.)

OTHER PUBLICATIONS

D. Carlson, "The Effects of Impurities and Temperature on Amorphous Silicon Solar Cells", IEEE Technical Digest for the 1977 IEDM in Washington, D.C., pp. 214–217 (IEEE New York, 1977).

(List continued on next page.)

*Primary Examiner*—Stephen D. Meier
(74) *Attorney, Agent, or Firm*—Eric J. Robinson; Nixon Peabody LLP

(57) ABSTRACT

A non-single-crystalline semiconductor material and a device utilizing the material, the material being of an intrinsic or substantially intrinsic conductivity type and including silicon and containing a dangling bond neutralizer consisting of hydrogen and/or a halogven wherein the concentration of carbon contained in the semiconductor material is less than $4 \times 10^{18}$ and the concentration of boron contained in the semiconductor material is not higher than $2 \times 10^{17}$ atoms/cm³.

35 Claims, 5 Drawing Sheets

U.S. PATENT DOCUMENTS

| | | |
|---|---|---|
| 3,492,175 | 1/1970 | Conrad et al. . |
| 3,785,122 | 1/1974 | Yatsurugi et al. . |
| 3,892,606 | 7/1975 | Chappelow et al. . |
| 3,982,912 | 9/1976 | Yatsurugi et al. . |
| 4,009,058 * | 2/1977 | Mills .................................. 257/458 |
| 4,064,521 | 12/1977 | Carlson .................................. 357/2 |
| 4,109,271 | 8/1978 | Pankove ................................ 357/16 |
| 4,196,438 * | 4/1980 | Carlson .................................. 257/56 |
| 4,226,898 | 10/1980 | Ovshinsky et al. . |
| 4,239,554 | 12/1980 | Yamazaki . |
| 4,409,805 | 10/1983 | Wang . |
| 4,418,132 | 11/1983 | Yamazaki . |
| 4,425,143 | 1/1984 | Nishizawa . |
| 4,459,163 | 7/1984 | McDiarmid et al. . |
| 4,460,670 | 7/1984 | Ogawa . |
| 4,471,042 | 9/1984 | Komatsu et al. ...................... 430/64 |
| 4,485,146 | 11/1984 | Mizuhashi . |
| 4,490,208 | 12/1984 | Tanaka et al. . |
| 4,520,380 | 5/1985 | Ovshinsky et al. . |
| 4,549,889 | 10/1985 | Yamazaki . |
| 4,581,476 | 4/1986 | Yamazaki . |
| 4,591,892 | 5/1986 | Yamazaki . |
| 4,681,984 | 7/1987 | Moeller . |
| 4,710,786 | 12/1987 | Ovshinsky et al. . |
| 4,742,012 | 5/1988 | Matsumura et al. . |
| 4,758,527 | 7/1988 | Yamazaki . |
| 4,766,477 | 8/1988 | Nakagawa . |
| 4,843,451 | 6/1989 | Watanabe et al. . |
| 4,878,097 * | 10/1989 | Yamazaki .............................. 257/56 |
| 4,888,305 | 12/1989 | Yamazaki et al. . |
| 4,889,782 | 12/1989 | Yamazaki . |
| 4,889,783 | 12/1989 | Yamazaki . |
| 5,043,772 | 8/1991 | Yamazaki . |
| 5,077,223 | 12/1991 | Yamazaki .............................. 437/9 |
| 5,315,132 | 5/1994 | Yamazaki . |
| 5,349,204 * | 9/1994 | Yamazaki .............................. 257/56 |
| 5,391,893 | 2/1995 | Yamazaki . |
| 5,521,400 | 5/1996 | Yamazaki . |
| 5,543,636 | 8/1996 | Yamazaki . |

FOREIGN PATENT DOCUMENTS

| | | |
|---|---|---|
| 58-92218 | 6/1983 | (JP) . |
| 58-155774 | 9/1983 | (JP) . |
| 59-35423 | 2/1984 | (JP) . |
| 59-35488 | 2/1984 | (JP) . |
| 57-228158 | 7/1984 | (JP) . |
| 59-115574 | 7/1984 | (JP) . |
| 60-96391 | 9/1994 | (JP) . |

OTHER PUBLICATIONS

A. Delahoy and R. Griffith, "Impurities Effects In a–Si:H Solar Cells Due to Air, Oxygen, Nitrogen, Phosphine, or Monochlorosilane in the Plasma", Journal of Applied Physics, vol. 52, No. 10, pp. 6337–6346 (1981).

P. Vanier, et al., "Study of Gap States in a–Si:H Alloys By Measurements of Photoconductivity and Spectral Response of MIS Solar Cells", American Institute of Physics, Proceedings of the International Conference on Tetrahedrally Bonded Amorphous Semicondutors, Carefree, Arizona, pp. 237–232 (1981).

P. Vanier, et al., "New Features of the Temperature Dependence of Photoconductivity in Plasma–Deposited Hydrogenated Amorphous Silicon Alloys", Journal of Applied Physics, vol. 52, No. 8, pp. 5235–5242 (1981).

A. Delahoy, et al., "Impurity Effects in a–Si:H Solar Cells", IEEE Proceedings of the 15th Photovoltaic Specialists Conference, Kissimmee, Florida, pp. 704–712 (1981).

R. Corderman, et al., "Mass Spectrometric Studies of Impurities in Silane and Their Effects on the Electronic Properties of Hydrogenated Amorphous Silicon", Journal of Applied Phyusics, vol. 54, No. 7, pp. 3987–3992 (1983), submitted Sep., 1982.

D. Carlson, et al., Quarterly Report No. 2, SERI/PR–8254–1–T2, prepared under subcontract No. XJ–9–8254, pp. i–66 (Mar. 1980).

D. Carlson et al., Quarterly Report No. 4, SERI/PR–0–9372–4, prepared under subcontract No. XG–0–9372–1, pp. i–33 (Nov. 1981).

The prior work of C.C. Tsai as evidenced by the document: C.C. Tsai, et al., "Amorphous Si Prepared in a UHV Plasma Deposition System", Journal on Non–Crystalline Solids, Proceedings of the Tenth International Conference on Amorphous and Liquid Semiconductors in Tokyo, Vols. 59&60, pp. 731–734 (1983).

Z. Hirose, "Amorphous Silicon", *Nikkei Electronics*—Special Issue, pp. 163–179 (Dec. 20, 1982).

J. Lorenz, "A Survey of the Preparation, Purity and Availability of Silanes", prepared under subcontract No. CL–3–00321–01, pp. i–73 (Dec. 1983), including the references cited on pp. 15–18.

Yusa, et al., "Ultrahigh Purification of Silane for Semiconductor Silicon", Journal of the Electrochemical Society: Solid–State Science and Technology, vol. 122, No. 12, pp. 1700–1705 (1975).

T. Takaishi, et al., "Changes in the Sieving Action and Thermal Stability of Zeolite a Produced by Ion–Exchange", Journal of the Chemical Society: Faraday Transactions I, part. 1, pp. 97–105 (1975).

D. Carlson, "Amorphous Thin Films for Terrestrial Solar Cells", D.E. Carlson, Journal of Vacuum Science Technology, vol. 20, No. 3, pp. 290–295 (Mar. 1982).

C. Magee and D. Carlson, "Investigation of the Hydrogen and Impurity Contents of Amorphous Silicon by Secondary Ion Mass Spectrometry", *Solar Cells*, vol. 2, pp. 365–376 (1980).

A. Delahoy and R. Griffity, "Impurities Effects In a–Si:H Solar Cells Due to Air, Oxygen, Nitrogen, Phosphine, or Monochlorosilane in the Plasma", Journal of Applied Physics, vol. 52, No. 10, pp. 6337–6346 (1981).

W. Spear, et al., "Doping of Amorphous Silicon By Alkali Ion Implantations", Philosophical Magazine B, vol. 39, No. 2, pp. 159–165 (1979).

R. Kriegler, et al., "The Effect of HCl and $Cl_2$ on the Thermal Oxidation of Silicon", Journal of Electrochemical Society: Solid–State Science and Technology, p. 388–392 (1972).

D.E. Carlson, et al., "Research on High–Efficiency, Single–Junction, Monolithic, Thin–Film a–Si Solar Cells," Subcontract Report SERI/STR–211–2813 (1985).

S. Sze, "Physics of Semiconductor Devices", John Wiley & Sons, pp. 567–571 (1969).

H. Tuan, "Amorphous Silicon Thin Film Transistor and its Applications to Large–Area Electronics", Materials Research Society Symposia Proceedings, vol. 33, pp. 247–257 (1984).

C.C. Tsai, "Impurities in Bulk a–Si:H, Silicon Nitride, and at the a–Si:H/Silicon Nitride Interface", Material Research Society Symposia Proceedings, vol. 33, pp. 297–300 (1984).

Tsai et al., "Amorphous Si Prepared in a UHV Plasma Deposition System", Journal of Non–Crystalline Solids, Proceedings of the Tenth International Conference on Amorphous and Liquid Semiconductors in Tokyo, vols. 59 & 60, p. 731–734 (1983).

E.H. Snow, A.S. Grove, B.E. Deal; J. Appl. Phys., vol. 36, No. 5, pp. 1664–1673, Published 1965, "Ion Transport Phenomena in Insulating Films".

A.S. Grove, P. Lamond, et al.; Electro–Technology, p. 40–43, Published 1965; "Stable MOS Transistors".

B. Yurash and B.E. Deal; J. Electrochem. Soc., 15, 1191, Published 1968; "A Method for Determining Sodium Content of Semiconductor Processing Materials".

E.H. Nicollian and J.R. Brews, MOS (Metal–Oxide–Semiconductor) Physics and Technology, Chap. 5, "Control of Oxide Charges", pp. 754–775, 1982.

P.F. Schmidt, Solid–State Tech., 26(6), 147, 1983; "Furnace Contamination and its Remedies".

S. Mayo, J. Appl. Phys., 47, 4012, 1976.

J.R. Davis, Instabilities in MOS Devices, Chap. 4, "Mobile Ions", pp. 65–81, 1981.

P.F. Schmidt and C.W. Pearce, J. Electrochem. Soc., 128, pp. 630–636, 1981; "A Neutron Activation Analysis Study of the Sources of Transition Group Metal Contamination in the Silicon Device Manufacturing Process".

R.W. Lee, J. Chem. Phys., vol. 38, No. 2, pp. 448–455, 1963; "Diffusion of Hydrogen in Natural and Synthetic Fused Quartz".

G. Hetherington and L.W. Bell, Phys. Chem. Glasses, vol.8, No.5, pp 206–208, Oct. 1967; "Letter to the Editor".

R.J. Kriegler et al., J. Electrochem. Soc., 119, 388, 1972; "The Effect of $CHL$ and $CL_2$ on the Thermal Oxidation of Silicon".

R.J. Kriegler, Proc. Semiconductor Silicon 1973, The Electrochemical Society, Princeton, N.J., p. 363, 1973.

R.R. Hoffmeister, Wright–Patterson AFB Report No. GE–EE 74–24, pp. 56–71, 1974.

S. Mayo and W.H. Evans, J. Electrochem. Soc., 124, pp. 780–785, 1977; "Development of Sodium Contamination in Semiconductor Oxidation Atmospheres at 1000° C".

B.E. Deal, Jap. J. Appl. Phys., 16(Suppl. 16–1), pp. 29–35, 1977; " Invited: New Developments in Materials and Processing Aspects of Silicon Device Technology".

H. Dersch, J. Stuke and J. Beichler; Phys. Stat. Sol.(b)105, 265, 1981 " Electron Spin Resonance of Doped Glow–Discharge Amorphous Silicon".

M. Stutzmann, et al., Phy. Rev. 32, pp 23, 1985, "Light–Induced Metastable Defects In Hydrogenated Amorphous Silicon—A Systematic Study".

J. Knights, et al., "Phys. Rev. Lett., 39, 712, 1977" pp 279–284 (1980) "Electronic and Structural Properties of Plasma–Deposited a–Si:OH—The Story of $O_2$".

W. Beyer and R. Fisher, Appl. Phys. Lett., 31, 850, 1977.

J. Knights, R. Street, and G. Lucovski, Journal of Non–Crystalline Solids, 35&36, 279–284, 1980.

R. B. Swaroop, "Advances in Silicon Technology for the Semiconductor Industry", Solid State Technology, 1983, pp. 111–114.

R. Crandall, D. Carlson, and H. Weakleam, Applied Physics Letters., vol. 44, pp. 200–201, 1984 " Role of Carbon in Hydrogenated Amorphous Silicon Solar Cell Degradation".

G. Scilla and G. Ceaser, Xerox Corporation Reported, "Determination on Metallic Impurities in a–Si:H by SIMS" Surface and Interface Analysis, vol.4, No.6, 1982.

R. Colclaser, Wiley, "Microelectronics: Processing and Device Design", 1980.

A. Delahoy and R. Griffith, Proceeding of the 15th IEEE Photovoltaics Specialists Conference, IEEE Press, pp. 704–712, 1981, "Impurity Effects In a–Si:H Solar Cells".

S. Sze, "Physics of Semiconductor Devices", Div. of John Wiley & Sons, 1981.

M. Hirose, In Hydrogenated Amorphous Silicon, Semiconductors and Semimetals Series, vol. 21, 1984.

Paesler et al., Phys. Rev. Lett., 41, 1492, 1978, "New Development in the Study of Amorphous Silicon Hydrogen Alloys: The Story of O".

Y. Matsushita et al., Jap. J. Appl. Phys. 19, L101, 1980, "A Study on Thermally Induced Microdefects in Czochralski–Grown Silicon Crystals: Dependence on Annealing Temperature and Starting Materials".

J. Leroueille, Physics Stat. Sol. (A)67, 177, 1981, "Influence of Carbon of Carbon on Oxygen Behavior in Silicon".

D. Staebler, R. Crandall, and R. Williams, "Stability Tests on p–i–n Amorphous Silicon Solar Cells", Conference Record of the 15th IEEE Photovoltaic Specialists Conference, 249–250, 1981.

H. Branz, "Hydrogen Collision Model of Light–Induced Metastability in Hydrogenated Amorphous Silicon", Solid State Communications, in Press, Sep. 1997.

S. Guha, Conference Record of the 25th Photovoltaics Specialists Conference, pp. 1017–1022, IEEE Press, 1996, "Amorphous Silicon Alloy Solar Cells and Modules—Opportunities and Challenges".

D. Neamen, Semiconductor Physics and Devices, Irwin Press, 1992.

J. Pankove, Hydrogenated Amorphous Silicon, vol. 21 A,B, C,D Semiconductors and Semimetals Series, Academic Press, 1984.

B. Ali Khan and R. Pandya, "Activation Energy of Source–Drain Current in Hydrogenated and Unhydrogenated Polysilicon Thin–Film Transistors" IEEE Transactions on Electron Devices, vol. 37, No. 7, Jul. 1990.

A. Pecora et al., "Off–Current in Polycrystalline Silicon Thin Film Transistors: An Analysis of the Thermally Generated Component", Solid–State Electronics, vol. 38, No. 4, pp. 845–850, (1995).

D. Passoja et al., Some Aspects of the Structure–Properties Relationships Associated With Haze in SOS, Journal of Crystal Growth, vol. 58, 1982, pp. 44–52.

Silicon on Sapphire, Update II, Union Carbide, Bulletin 1980, F–EMG–5801–4M, 4 pages.

T.J. Donahue et al., PECVD of Silicon Epitaxial Layers, Semiconductor International, Aug. 1985, pp. 142–146.

R.P. Roberge et al., Gaseous Impurity Effects in Silicon Epitaxy, Semiconductor International, Jan. 1987, pp. 77–81.

N. Enomoto, Letter dated Oct. 15, 1997, confidential material, Re: Hydrogen Purity, 1 page.

S.K. Iya, Production of Ultra–High–Purity Polycrystalline Silicon, Journal of Crystal Growth, vol. 75, 1986, pp. 88–90.

L. Shive, Letter dated Apr. 25, 1983, 3 pages.

L. Williamson, Letter dated Apr. 5, 1983, Re: Polycrystalline Silicon Sample, 1 page.

Monosilane Polycrystal Boron–Free, Komatsu Electronic Metals Co., Ltd. , $SiH_4$ Material Data Sheet No. 101, 1981, 2 pages.

P.A. Taylor, Purification Techniques and Analytical Methods for Gaseous and Metallic Impurities in High–Purity Silane, Journal Crystal Growth, vol. 89, 1988, pp. 28–38.

A. Yusa et al., Ultrahigh Purification of Silane for Semiconductor Silicon, Journal of the Electrochemical Society, vol. 122, No. 12, Dec. 1975, pp. 1700–1705.

G. Robertson, et al., Boron–Free Silicon Detectors, Final Report of Sep. 1984 to Jun. 1988, Wright Research and Development Center, Materials Laboratory, WRDC–TR–90–4079, Sep. 1990, pp. 121–131.

J. Maurits et al., Abstracts of the Electrochemical Society, 90–2, 1990.

J. Lorentz, A Survey of the Preparation, Purity, and Availability of Silanes, A Subcontract Report, Solar Energy Research Institute, SERI STR–211–2092, Dec. 1983, pp. 1–73.

J. Lorentz, Monosilane and Disilane: 1984 Status Report, A Subcontract Report, Solar Energy Research Institute, SERI STR–211–2575, Mar. 1985, pp. 1–34.

Silicon Source Gases for Chemical Vapor Deposition, Solid State Technology, May 1989, pp. 143–147.

R. Coderman et al., Mass Spectrometric Studies of Impurities in Silane and Their Effects on the Electronic Properties of Hydrogenated Amorphous Silicon, J. Appl. Phys., vol. 54, No. 7, Jul. 1983, pp. 3987–3992.

R. R. Coderman, Ph.D., Letter dated May 11, 1984, 4 pages.

C. Magee et al., Investigation of the Hydrogen and Impurity Contents of Amorphous Silicon by Secondary Ion Mass Spectrometry, Solar Cells, vol. 2, 1980, pp. 365–376.

T. Takahashi et al., Instrumentation, 47, 3, 1976.

Metheson Gases and Equipment Catalogue, 1992.

J. Maurits, Advanced Silicon Materials Inc., 1997.

J. Maurits, Advanced Silicon Materials Inc. 1997.

P. Schmidt, Contamination–Free High Temperature Treatment of Silicon or Other Materials, J. Electrochem. Soc.: Solid–State Science and Technology, Jan. 1983, pp. 186–189.

J. Maurits et al., The Effect of Polysilicon Impurities on Minority Carrier Lifetime in CZ Silicon Crystals, 22nd IEEE Photovoltaic Specialists Conference, Oct. 1991, pp. 309–314.

Silane—Ultraplus ™ II $SiH_4$, Linde Union Carbide Specialty Gases Product Information, May 10, 1990, 2 pages.

Silane Specifications, Union Carbide, Revised Nov. 22, 1985, 1 page.

Polysilicon Evaluation Report, Union Carbide Corp., Mar. 19, 1985, 1 page.

J.E.A. Maurits, SOS Wafers—Some Comparisons to Silicon Wafers, IEEE Transactions on Electron Devices, vol. ED–25, No. 8, Aug. 1978, pp. 359–363.

J.E.A. Maurits, Problems and Solutions in the Preparation of SOS Wafers, Solid State Technoloty, Apr. 1977, 6 pages.

T. Deacon, Silicon Epitaxy: An Overview, Microelectronic Manufacturing and Testing, Sep. 1984, pp. 89–92.

H. Boyd, Non–Contaminating Gas Containment, Control, and Delivery Systems for VLSI–Class Wafer Fabrication, Microelectronic Manufacturing and Testing, Mar. 1984, pp. 1–6.

J. L. Briesacher et al., Gas Purification and Measurement at the PPT Level, J. Electrochem. Soc., vol. 138, No. 12, Dec. 1991, pp. 3717–3718 and 3723.

A. Homyak et al., Delivering Hydrogen to Meet < 1 ppb Impurity Levels Without the Use of Purifiers, Solid State Technology, Gas Handling and Delivery, Oct. 1995, 4 pages.

Friedel and Ladenburg, Annalen 143,124, 1967.

A. Stock and C, Ber. 55, 3961, 1922.

H.J. Emeleus et al., The Oxidation of the Silicon Hydrides.Part I, Imperial College, S.W. 7., Jun. 27, 1935, pp. 1182–1189.

H.J. Emeleus and K. Stewart, J. Chem. Soc. PP 1182, 1936.

W. Shockley, Transistor Electronics:Imperfections, Unipolar and Analog Transisters*, Proceedings of the I.R.E. , Nov. 1952, pp. 1289–1313.

C. Magee et al., Investigation of the Hydrogen and Impurity Contents of Amorphous Silcon by Secondary Ion Mass Spectrometry*, Solar Cells, 2, 1980, pp. 365–376.

R.S. Crandall et al., Appl. Phys. Letters, 44(2), pp. 200–201, 1984.

K.A. Dumas et al., Characterization of Hem Silicon for Solar Cells, Conference Record of the 15th IEEE Photovoltaic Specialists Conference, 1981, pp. 954–958.

T. Saito et al., A New Directional Solidification Technique for Polycrystalline Solar Grade Silicon, Conference Record of the 15th IEEE Photovoltaic Specialists Conference, 1981, pp. 576–580.

T. Nozaki, Concentration and Behavior of Carbon in Semiconductor Silicon, J. Electrochemical Soc. Solid State Science, vol. 117, No. 12, Dec. 1970, pp. 1566–1568.

D.E. Carlson et al., The Effect of Fluorine on the Performance of Amprphous Silicon Solar Cells, Conference Record of the 15th IEEE Photovoltaic Specialists Conference, 1981, pp. 694–697.

T.F. Ciszek et al., Growth of Silicon Sheets From Metallurgical–Grade Silicon, Conference Record of the 15th IEEE Photovoltaic Specialists Conference, 1981, pp. 581–588.

A.E. Delahoy et al., Impurity Effects in a–Si:H Solar Cells Due to Air, Oxygen, Nitrogen, Phosphine, or Monochiorosllane in the Plasma, Journal of Applied Physics, vol. 52, No. 10, Oct. 1981, pp. 6337–6347.

R.E. Griffith et al., Advanced Amorphous Materials for Photovoltaic Conversion, Semiannual Report, Oct. 1, 1979–Mar. 31, 1980, Department of Energy and Environment, Brookhaven National Laboratory, pp. 1–33.

A.E. Delahoy et al., Impurity Effects in a–Si:H Solar Cells, Conference Record of the 15th IEEE Photovoltaic Specialists Conference, 1981, pp. 704–712.

P.G. LeComber et al., Electrical and Photoconductive Properties of Ion Implanted Amorphous Silicon, Journal of Non–Crystalline Solids, 35 & 36, 1980, pp. 327–332.

Charles Feldman et al., Vacuum Deposited Polycrystalline Silicon Solar Cells for Terrestrial Use, The Conference Record of the 14th IEEE Photovoltaic Specialists Conference, 1980, pp. 391–396.

J.I. Hanoka et al., A Combined Quantitative Ebic and Ion Microprobe Analysis of SiC Particles in EFG Ribbon, The Conference Record of the 14th IEEE Photovoltaic Specialists Conference, 1980, pp. 478–483.

J.I. Hanoka, et al., Efficient Polycrystalline Solar Cells Made From Low–Cost Refined Metallurgical Silicon, The Conference Record of the 13th IEEE Photovoltaic Specialists Conference, 1978, pp. 485–489.

W.E. Spear et al., Doping of Amorphous Silicon by Alkali–Ion Implantations, Philosophical Magazine B, vol. 39, No. 2, 1979, pp. 159–165.

R.A. Gibson et al., J. Non–Crystalline Solids, 35 & 36, pp. 725–730, 1980.

T.I. Kamins et al., Mosfets in Laser–RecrystallizedPoly–Silicon on Quartz, IEEE Electron Device Letters, vol. EDL–1, No. 10, Oct. 1980, pp. 214–216.

R.S. Sussmann et al., Laser Annealing of Glow Discharge Amorphous Silicon, J. Non–Crystalline Solids, 35 & 36, 1980, pp. 249–254.

S. Onga et al., Characterization of Polycrystalline Silicon MOS Transistors, Japanese Journal of Applied Phyusics, vol. 21, No. 10, Oct., 1982, pp. 1472–1478.

S. Yamazaki et al., An Amorphous Silicon Solar Cell Having a Converstion Efficiency of 10.50 Percent, IEEE Electron Device Letters, vol. EDL–5, No. 8, Aug. 1984, pp. 315–318.

C.C. Tsai et al.,Clean a–Si:H Prepared in a UHV System, Journal of Non–Crystalline Solids, 66 1984, pp. 45–50.

M. Ohnishi et al., Preparation and Photovoltaic Characteristics of a–Si Solar Cells Produced by a Consecutive, Separated Reaction Chamber Method, Japanese Journal of Applied Physics, Vo. 21, 1982, Supplement 21–2, pp. 231–237.

O. Tsuji et al., Proceedings of the 6th International Symposium on Plasma Chemistry, vol. 3, pp. 782–786, 1983.

Y. Kuwano, et al., Preparation and Properties of Amorphous Silicon Produced by a Consecutive, Separated Reaction Chamber Method, Japaneses Journal of Applied Physics, vol. 21, No. 3, Mar. 1982, pp. 413–417.

P.A. Iles et al., Effect of Impurity Doping Concentration on Solar Cell Output, 11th IEEE Photovoltaic Spec. Conf., 1982, pp. 19–24.

P. Sichanugrist et al., Amorphous Silicon Solar Cells With Graded Boron–Doped Active Layers, Journal of Applied Physics, vol. 54, No. 11, Nov. 1983, pp. 6705–6707.

N. Szydlo et al., High Current Post–Hydrogenated Chemical Vapor Deposited Amorphous Silicon P–I–N Diodes, Applied Physics Letters, vol. 40, No. 11, Jun. 1982, pp. 988–990.

K. Katoh et al., Amorphous–Silicon Silicon–Nitride Field– Effect Transistors, Electronics Letters, vol. 18, No. 14, May 26, 1982, pp. 599–600.

M. Matsumura, (Invited) Amorphous Silicon Transistors and Integrated Circuits, Japanese Journal of Applied Physics, vol. 22, Supplement 22–1, 1983, pp. 487–491.

P.G. LeComber et al., Amorphous–Silicon Field–Effect Device and Possible Application, Electronics Letters, vol. 15, No. 6, Mar. 15, 1979, pp. 179–181.

H.C. Tuan, Amorphous Silicon Thin Film Transistor and Its Applications to Large Area Electronics, Materials Research, Society, Symp. Proc. vol. 33, 1984, pp. 247–257.

C.C. Tsai et al., Impurities in Bulk, a–Si:H, Silicon Nitride, and at the a–Si:H/Silicon Nitride Interface, Mat. Res. Soc. Symp. Proc. vol. 33, 1984, pp. 297–300.

H. Fritzsche, Characterization of Glow–Discharge Deposited a–Sil:H, Soler Energy Materials 3 1980, pp. 447–501.

R.S. Sussmann et al., J. Non–Crystalline Solids, 35 & 36, pp. 249–254, 1980.

M. Hirose et al., Defect Compensation in Doped CVD Amorphous Silicon, Journal of Non–Crystalline Solids, 35 & 36, 1980, pp. 297–302.

J. Ishikawa et al., The Effects of Oxygen, Hydrogen and Fluorine on the Conductivity of High Purity Evaporated Amorphous Silicon Films, Journal of Non–Crystalline Solids, 45, 1981, pp. 271–281.

N. Sol et al., J. Non–Crystalline Solids, 35 & 36, pp. 291, 1980.

R.G. Wolfson et al., Ion–Implanted Thin–Films Solar Cells on Sheet Silicon, IEEE Photovoltaic Specialists Conference, 1981, pp. 595–597.

D.E. Carlson, Recent Developments in Amorphous Silicon Solar Cells, Solar Energy Materials, 3, 1980, pp. 503–518.

D.E. Carlsain, Amorphous Thin Films for Terrestrial Solar Cells, Journal of Vacuum Science & echnology, vol. 20, No. 3, Mar. 1982, pp. 290–295.

D.E. Carlson et al., Amorphous Silicon Solar Cells, Quarterly Report No. 4, for the period Jul. 1, 1981 to Sep. 30, 1981, Nov. 1981, pp. 1–33.

A. Yusa et al., Ultrahigh Purification of Silane for Semiconductor Silicon, J. Electrochem. Soc.: Solid–State Science and Technology, Dec. 1975, pp. 1700–1705.

S.J. Solomon, Silicon From Silane Through Plasma Deposition, Conference Record of the 15th IEEE Photovoltaic Specialists Conference, 1981, pp. 569–571.

P.E. Vanier et al., New Features of the Temperature Dependence of Photoconductivity in Plasma–Deposited Hydrogenated Amorphous Silicon Alloys, J.Appl. Phys. vol. 52, No. 8, Aug. 1981, pp. 5235–5242.

J.R. Davis et al., Silicon Solar Cells From Transition Metal Doped Czochralski and Web Crystals, Conference Record of the 12th IEEE Photovoltaic Specialists Conference, 1976, pp. 106–111.

M. Wolf et al., Silicon Fluoride Transport: Summary of Current Results and Interim Assessment, Conference Record of the 12th IEEE PHotovoltaic Specialists Conference, 1976, pp. 137–145.

W.E. Spear, Doped Amorphous Semiconductors, Advances in Physics, vol. 26, No. 6, Nov. 1977, pp. 811–845.

P. Viktorovitch et al., Determination of the Electronic Density of States in Hydrogenated Amorphous Silicon (a–SiH) From Schottky Diode Capacitance–Voltage and Conductance–Voltage Measurements, Journal of Non–Crystalline Solids, 35 & 36, 1980, pp. 569–574.

C.H. Hyun et al., DLTS Response Due to Localized States in Hydrogenated Amorphous Silicon, Journal of Non–Crystalline Solids, 46, 1981, pp. 221–234.

W.E. Spear et al., Electronic Properties of Substitutionally Doped Amorphous SI, Philosophical Magazine, vol. 33, No. 6, 1976, pp. 935–949.

J.R. McCormick, Preparation and Characterization of Low Cost Silicon Substrates for Epitaxial Solar Cell Applications, Proceedings of the 14th IEEE Photovoltaic Specialists Conference, 1980, pp. 298–302.

J.M. McBain, Sorption by Chabasite, Other Zeolites and Permeable Crystals, The Sorption of Gases and Vapours by Solids, Rutledge & Sons, Ltd., London, 1932, pp. 167–176.

A. Yusa et al., Ultrahigh Purification of Silane for Semiconductor Silicon, J. Electrochem. Soc.: Solid–State Science and Technology, vol. 122, No. 12, Nov. 1975, pp. 1700–1705.

T. Takahashi et al., Changes in the Sieving Action and Thermal Stability of Zeolite A Produced by Ion–Exchange, Faraday Transactions I, Journal of Physical Chemistry pt. 1, 1975, pp. 97–105.

T. Ohgushi et al., The Molecular Sieving Action of Ion–Exchanged Zeolites A, Bulletin of the Chemical Society of Japan, vol. 51, No. 2, 1978, pp. 419–421.

D.E. Carlson et al., Amorphous Silicon Solar cell, Applied Physics Letters, vol. 28, No. 11, Jun. 1, 1976, pp. 671–673.

D.L. Staebler et al., Reversible Conductivity Changes in Discharge–Produced Amorphous, Applied Physics Letters, vol. 31, No. 4, Aug. 15, 1977, pp. 292–294.

C.R. Wronski, The Light Induced Changes in a–Si:H Materials and Solar Cells—WhereWe Are Now, MRS (to be publihed), 1997, 11 pages.

T. Kamei et al., Deposition and Extensive Light Soaking of Highly Pure Hyarogenated Amorphous Silicon, Applied Physics Letters, vol. 68, No. 17, Apr. 22, 1996, pp. 2380–2382.

M. Stutzmann et al., Light–Induced Metastable Defects in Hydrogenated Amorphous Silicon: A Systematic Study, Phyusical Review B, The American Physical Society, vol. 32, No. 1, Jul. 1, 1985, pp. 23–47.

C.C. Tsai et al., Amorphous Si Prepared in a UHV Plasma Deposition System, Journal of Non–Crystalline Solids, Vols. 59 & 60, 1983, pp. 731–734.

C.C. Tsai et al., The Staebler–Wronskieffect in Undoped a–Si:H Its Intrinsic Nature and the Influence of Imprurities, American Institute of Physics, 1984, pp. 242–249.

B.R. Weinberger et al., AM–1 Short Circuit Currents in Small Area Pin a–SiH$_x$ Solar Cells, 16th IEEE Photovoltaic Specialists Conference, 1982, pp. 1316–1320.

R. Plattner et al., Influence of Impurities and Doping Residues on the Stability Behavior of a–Si:H and a–Sige:H–Pin Cells, 18th IEEE Photovoltaic Specialists Conference, 1985, pp. 1598–1603.

C.R. Wronski et al., Recombination Centers in Phosphorous Doped Hydrogenated Amorphous Silicon, Solid State Communications, vol. 44, No. 10, 1982, pp. 1423–1426.

G. Lucovsky, Expert Report. Semiconductor Energy Lab. Vs. Samsung, 1997.

C.W. Magee, Expert Report, Semiconductor Energy Lab. Vs. Samsung, 1997.

C.C. Tsai, M.J. Thompson and H.C. Tuan, Mat. Res. Symp. Proc. 33, 297, 1984.

C.W. Magee, J.C. Bean, G. Foti and J.M. Poate, Thin Solid Films 81, 1, 1981.

J.C. Bean, J.M. Poate, Appl. Phys. Letters, 36, 59, 1980.

G. Foti, J.C. Bean, J.M. Poate and C.W. Magee, Appl. Phys. Letters, 36, 840, 1980.

T. Yamamoto, S. Yamamoto, S. Tomita, K. Okuno, F. Soeda, Y. Murata and A. Isitani, SIMS X, ed. by A. Benninghoven, B. Hagendorf and H.W. Werner, John Wiley & Sons, Chichester, 1997.

S. Smith, Expert Report, Semiconductor Energy Lab. Vs. Samsung, 1997.

Palz, W. et al., "Photovoltaic Solar Energy Conference", Proceedings of International Conference, held at Athens, Greece, Oct. 17–21, 1983, D. Reidel Publishing Company, 6 pages submitted including letter to publisher dated Mar. 10, 1999.

D.E. Carlson, et al.; "Amorphous Silicon Solar Cells"; pp. 1–71; Feb. 1981; Solar Energy Research Institute/ PR–9372–1–TI Quarterly Report No. 1.

D.E. Carlson, et al.; "Amorphous Silicon Solar Cells"; pp. 1–61; May 1981, Solar Energy Research Istitute/ PR–0–9372–2 Quarterly Report No. 2.

D.E. Carlson, et al.; "Amorphous Silicon Solar Cells"; pp. 1–47; Aug. 1981; Solar Energy Research Institute/ PR–0–9372–3 Quarterly Report No. 3.

D.E. Carlson, et al.; "Amorphous Silicon Solar Cells"; pp. 1–33; Nov. 1981; Solar Energy Research Institute/ PR–0–9372–4 Quarterly Report No. 4.

D.E. Carlson, et al.; "Amorphous Silicon Solar Cells"; pp. 1–137; Mar. 1982; Solar Energy Research Institute/ PR–0–9372–5 Final report.

Margaret D. Cotton; "The Photovoltaic R&D Program at SERI An Overview Report"; pp. 1–24; Jan. 1981; Solar Energy Research Institute/SP–612–965.

D.E. Carlson; "Amorphous Thin Films for Terrestrial Solar Cells"; pp. 290–295; Mar. 1982; J. Vac. Sci. Technology, 20 (3).

D.E. Carlson; "Light–Induced Effects in Amorphous Silicon Films and Solar Cells"; pp 1372–1375; 1982 IEEE, 0160–8371/82/0000–1372.

Matsumura, Japanese Journal of Applied Physics, (*Invited*) *Amorphous Silicon Transistors and Integrated Circuits*, 1983.

P.G. LeComber, Electronics Letters, *Amorphous–Silicon Field–Effect Device and Possible Application*, Mar. 15, 1979.

K. Roy, IEEE Electron Device Letters 1980.

Affidavit of Chuang Chuang Tsai, Jun. 7, 1995.

C.C. Tsai, Tenth International Conference on Amorphous and Liquid Semiconductoss, *Glow Discharge a–Si:H Produced in a UHV System*, Tokyo, Aug. 22–26, 1983 (Abstract).

C.C. Tsai, Journal of Non–Crystalline Solids, *Amorphous Si Prepared in a Uhv Plasma Deposition System*, (1983, published, Jan. 16, 1984.

T.I. Kamins, IEEE Electron Device Letters, *MOSFETs in Laser–Recrystallized Poly–Silicon on Quartz*, Oct. 1980.

A.E. Delahoy et al., Conf. Record, 15th IEEE Photovoltare Specialists Conf. (1981), pp. 704–712.

Nikkei Electronics, Zenko Hirose, Dec. 20, 1982, p. 168 (English Translation to be filed).

Journal of Non–Crystalline Solids (Vol. 68, 1984) Magee & Carlson, "Investigation of the Hydrogen and Impurity Contents of Amorphous Silicon by Secondary Ion Mass Spectrometry", Solar Cells, vol. 2, pp 365–376 (1980).

M. Moller et al., Conference Record, 167th IEEE Photovoltaic Specialists Conference (Sep. 1982), pp. 1376–1380 "Low Level Boron Doping & Light–Induced Effects in Amorphous Silicon Pin Solar Cells".

Y. Hamakawa, Amorphous Semiconductor Technologies and Devices, pp. 194, 198 (1982).

Japanese Patent No. 55–29155 issued Mar. 1, 1980 to Yamazaki.

Japanese Patent No. 57–40940 issued Mar. 6, 1982 to Shibamata et al.

Japanese Patent No. 54–136274 issued Oct. 23, 1979 to Hayafuji et al.

Uchida et al., "Large Area Amorphous Silicon Solar Cell", Denshi Zairyou, Jan. 1980, pp. 75–81.

Hirose, "Amorphous Silicon Material", Denshi Zairyou, Jan. 1981, pp. 56–58.

Japanese Patent No. 56–4287 issued Jan. 17, 1981 to Carlson.

Japanese Patent No. 56–45083 issued Apr. 24, 1981 to Carlson.

Japanese Patent No. 58–92218 issued Jun. 1, 1983 to Yamazaki.

Scilla et al., Determination of Metallic Impurities in a–Si:H by SIMS, Surface and Interface Analysis, vol. 4, No. 6, 1982, pp. 253–254.

Japanese Patent No. 57–187972 issued Nov. 18, 1982 to Uchida et al.

Japanese Patent No. 56–64476 issued Jun. 1, 1981 to Allen et al.

Japanese Patent No. 57–1272 issued Jan. 6, 1982 to Uchida et al.

Japanese Patent Document 57–13777 with English translation published Jan. 23, 1982, Japan.

U.S. Patent No. 4,582,395 issued Apr. 15, 1986, Morozumi.

U.S. Patent No. 5,294,555 issued Mar. 15, 1994, Mano et al.

U.S. Patent No. 4,469,427 issued Sep. 4, 1984, Sugano et al.

Szydlo et al., "High Current Post–Hydrogenated Chemical Vapor Deposited Amorphous Silicon PIN Diodes", pp. 988–990, Jun. 1, 1992 (cited in Supplemental Expert Report of Catalano).

Kamei et al., "Deposition and Extensive Light Soaking of Highly Pure Hydrogenated Amorphous Silicon", pp. 2380–2382, 222 Apr. 1996 (cited in Supplemental Expert Report of Catalano).

Ohrishi et al., The annual meeting of applied physics in Japan (1980) 3p–T–12.

Sakai et al., The 28th annual meeting of Japan Society of Appl. Phys. (Spring 1981) 29p–T–2.

Ishiwata et al., The 28th annual meeting of Japan, Society of Appl. Phys. (Spring 1981) 1a–5–9.

IEEE photovaltaic specialiss conference, San Diego, CA Sep. 27–30, 1982, Published Jan. 1983.

Amorphous Semiconductor, Technologies and Devices, 1982, Editor Y. Hamakawa, et al., pp 194–198 North Holland Publishing Corporation [QC 611.8 A5J3].

Magee, "Investigations of the Hydrogen and Impurity Contents of Amorphous Silicon by Secondary Ion Mass Spetrometry", Solar Cells, vol.2 (1980) 365–376.

M. Moller et al. Conference Record, 16th IEEE Photovoltaic Specialist Conf. (Sep. 1982) pp. 1376–1380.

Sakai et al, The 28th Ann Meeting of Impur Society of Apply Phys 38–7–12 p. 413, 1980.

* cited by examiner

SEMICONDUCTOR HAVING LOW CONCENTRATION OF PHOSPHOROUS

This is a Divisional application of Ser. No. 08/350,169, filed Nov. 30, 1994; now abandoned which itself is a continuation of Ser. No. 07/748,421, filed Aug. 22, 1991; now abandoned which itself was a divisional of Ser. No. 07/443,015, filed Nov. 29, 1989, now U.S. Pat. No. 5,077,223; which was a continuation of Ser. No. 06/785,586, filed Oct. 8, 1985; now abandoned which was a divisional of Ser. No. 06/564,213, filed Dec. 22, 1983, now U.S. Pat. No. 4,581,476, which in turn, was a continuation-in-part of Ser. No. 06/525,459 filed Aug. 22, 1983, now U.S. Pat. No. 4,591,892.

BACKGROUND OF THE INVENTION

1. Field of the Invention

The present invention relates to a photoelectric conversion device which has a non-single-crystal semiconductor laminate member having formed therein at least one PIN junction, and a method for the manufacture of such a photoelectric conversion device.

2. Description of the Prior Art

A photoelectric conversion device of the type including a non-single-crystal semiconductor laminate member having formed therein at least one PIN junction usually has the non-single-crystal semiconductor laminate member formed on a substrate having a conductive surface and a conductive layer formed on the non-single-crystal semiconductor laminate member. The non-single-crystal semiconductor laminate member has at least a first non-single-crystal semiconductor layer of a P or N first conductivity type, an I type second non-single-crystal semiconductor layer formed on the first non-single-crystal semiconductor layer, and a third non-single-crystal semiconductor layer formed on the second non-single-crystal semiconductor layer and having a second conductivity type opposite from the first conductivity type. The first, second, and third non-single-crystal semiconductor layers form one PIN junction.

In this case, for example, the substrate has such a structure that a light-transparent conductive layer is formed as a first conductive layer on a light-transparent insulating substrate body. The first and third non-single-crystal semiconductor layers of the non-single-crystal semiconductor laminate member are P- and N-type, respectively. Further, the conductive layer on the non-single-crystal semiconductor laminate member is formed as a second conductive layer on the N-type third non-single-crystal semiconductor layer.

With the photoelectric conversion device of such a structure as described above, when light is incident on the side of the light-transparent substrate towards the non-single-crystal semiconductor laminate member, electron-hole pairs are created by the light in the I-type second non-single-crystal semiconductor layer. Holes of the electron-hole pairs thus created pass through the P-type first non-single-crystal semiconductor layer to reach the first conductive layer, and electrons flow through the N-type third non-single-crystal semiconductor layer into the second conductive layer. Therefore, photocurrent is supplied to a load which is connected between the first and second conductive layers, thus providing a photoelectric conversion function.

In conventional photoelectric conversion devices of the type described above, however, since the I-type second non-single-crystal semiconductor layer is formed to contain oxygen with a concentration above $10^{20}$ atoms/cm$^3$, and/or carbon with a concentration above $10^{20}$ atoms/cm$^3$, and/or phosphorus with a concentration as high as above $5\times10^{17}$ atoms/cm$^3$, the I-type non-single-crystal semiconductor layer inevitably contains impurities imparting N conductivity type, with far lower concentrations than in the P-type first non-single-crystal semiconductor layer and the N-type third non-single-crystal semiconductor layer.

In addition, the impurity concentration has such a distribution that it undergoes substantially no variations in the thickness direction of the layer.

On account of this, in the case where the second non-single-crystal semiconductor layer is formed thick with a view to creating therein a large quantity of electron-hole pairs in response to the incidence of light, a depletion layer, which spreads into the second non-single-crystal semiconductor layer from the PI junction defined between the P-type first and the I-type second non-single-crystal semiconductor layers, and a depletion layer, which spreads into the second non-single-crystal semiconductor layer from the NI junction defined between the N-type third and the I-type second non-single-crystal semiconductor layers, are not linked together. In consequence, the second non-single-crystal semiconductor layer has, over a relatively wide range thickness thereof at the central region in that direction, a region in which the bottom of the conduction band and the top of the valence band of its energy band are not inclined in the directions necessary for the holes and electrons to drift towards the first and third non-single-crystal semiconductor layers, respectively. Therefore, the holes and electrons of the electron-hole pairs created by the incident light in the second non-single-crystal semiconductor layer, in particular, the electrons and holes generated in the central region of the second layer in its thickness direction, are not effectively directed to the first and third non-single-crystal semiconductor layers, respectively.

Accordingly, the prior art photoelectric conversion devices of the above-described structure have the defect that even if the second non-single-crystal semiconductor layer is formed thick for creating a large quantity of electron-hole pairs in response to incident light, a high photoelectric conversion efficiency cannot be obtained.

Further, even if the I-type second non-single-crystal semiconductor layer is thick enough to permit the depletion layer extending into the second non-single-crystal semiconductor layer from the PI junction between the P-type first non-single-crystal semiconductor layer on the side on which light is incident and the I-type second non-single-crystal semiconductor layer formed on the first semiconductor layer and the depletion layer extending into the second non-single-crystal semiconductor layer from the NI junction between the N-type third non-single-crystal semiconductor layer on the side opposite from the side of the incidence of light and the I-type second non-single-crystal semiconductor layer are linked together, the expansion of the former depletion layer diminishes with the lapse of time for light irradiation by virtue of a known light irradiation effect commonly referred to as the Staebler-Wronski effect, because the I-type non-single-crystal semiconductor layer forming the PI junction contains impurities which impart N conductivity type as mentioned previously. Finally, the above-said depletion layers are disconnected from each other. In consequence, there is formed in the central region of the second non-single-crystal semiconductor layer in the thickness direction thereof a region in which the bottom of the conduction band and the top of the valence band of the energy band are not inclined in the directions in which the holes and electrons of the electron-hole pairs created by the incidence of light are drifted towards the first and third non-single-crystal semiconductor layers, respectively.

Accordingly, the conventional photoelectric conversion devices of the above-said construction have the defect that the photoelectric conversion efficiency is impaired by the long-term use of the devices.

SUMMARY OF THE INVENTION

It is therefore an object of the present invention to provide a novel photoelectric conversion device which is able to achieve a far higher photoelectric conversion efficiency than that obtainable with the conventional devices described above.

Another object of the present invention is to provide a novel photoelectric conversion device the photoelectric conversion efficiency of which is hardly or only slightly lowered by the Staebler-Wronski effect even if it is used for a long period of time.

Yet another object of the present invention is to provide a novel method which permits easy manufacture of the photoelectric conversion device having the above-said excellent features.

In accordance with an aspect of the present invention, the first (or third) non-single-crystal semiconductor layer of the non-single-crystal laminate member is a layer on the side on which light is incident and is of P conductivity type, and the I-type second non-single-crystal semiconductor layer has introduced therein an impurity for imparting thereto type P conductivity, which is distributed so that the impurity concentration continuously decreases towards the third (or first) non-single-crystal semiconductor layer in the thickness direction of the I-type layer.

In this case, for example, the substrate is light-transparent and, accordingly, the first non-single-crystal semiconductor layer is disposed on the side where light is incident. The first and third non-single-crystal semiconductor layers are P- and N-type, respectively, and the I-type second non-single-crystal semiconductor layer has introduced therein an impurity for imparting thereto P-type conductivity, such as boron, so that its concentration in the region adjacent the first non-single-crystal semiconductor layer is higher than the concentration in the region adjacent the third non-single-crystal semiconductor layer.

On account of this, even if the I-type second non-single-crystal semiconductor layer is formed relatively thick for creating therein a large quantity of electron-hole pairs in response to the incidence of light, the depletion layer extending into the second non-single-crystal semiconductor layer from the PI junction between the first and second non-single-crystal semiconductor layers and the depletion layer extending into the second non-single-crystal layer from the NI junction between the third and second non-single-crystal semiconductor layers are joined together. Accordingly, the holes and electrons which are produced in the central region of the second non-single-crystal semiconductor layer in its thickwise direction are also effectively drifted towards the first and third non-single-crystal semiconductor layers, respectively.

Moreover, even if the I-type second non-single-crystal semiconductor layer contains impurities which impart N-type conductivity thereto, because it is formed to contain oxygen and/or carbon and phosphorus in large quantities as described previously, boron, which imparts P-type conductivity and is introduced into the second non-single-crystal semiconductor layer, combines with oxygen, and/or carbon, and/or phosphorus. Besides, the P-type impurity introduced into the second non-single-crystal semiconductor layer has a high concentration in the region thereof adjacent the P-type first non-single-crystal semiconductor layer, that is, on the side of the PI junction. Therefore, the expansion of the depletion layer spreading into the second non-single-crystal semiconductor layer from the PI junction between the first and second non-single-crystal semiconductor layers is scarcely or only slightly diminished by the light irradiation effect (the Staebler-Wronski effect).

Accordingly, the photoelectric conversion device of the present invention retains a high photoelectric conversion efficiency, even if used for a long period of time.

In accordance with another aspect of the present invention, the second non-single-crystal semiconductor layer, which has introduced thereinto an impurity which imparts P-type conductivity, with such a distribution that its concentration continuously decreases towards the N-type third (or first) non-single-crystal semiconductor layer in the thickness direction of the second layer, can easily be formed, through a CVD (Chemical Vapor Deposition) method using a semiconductor material gas and an impurity material gas for imparting P-type conductivity, merely by continuously decreasing (or increasing) the concentration of the depart material gas relative to the semiconductor material gas with the lapse of time.

Accordingly, the manufacturing method of the present invention allows easy fabrication of the photoelectric conversion device of the present invention which possesses the aforementioned advantages.

Other objects, features and advantages of the present invention will become more fully apparent from the detailed description taken in conjunction with the accompanying drawings.

BRIEF DESCRIPTION OF THE DRAWINGS

FIGS. IA to D are sectional views schematically illustrating a sequence of steps involved in the manufacture of a photoelectric conversion device in accordance with an embodiment of the present invention.

DESCRIPTION OF THE PREFERRED EMBODIMENTS

A description will be given of, with reference to FIGS. 1 and 2, of a first embodiment of the photoelectric conversion device of the present invention, along with the manufacturing method of the present invention.

The manufacture of the photoelectric conversion device starts with the preparation of an insulating, light-transparent substrate 1 as of glass (FIG. 1).

Figure 1A:
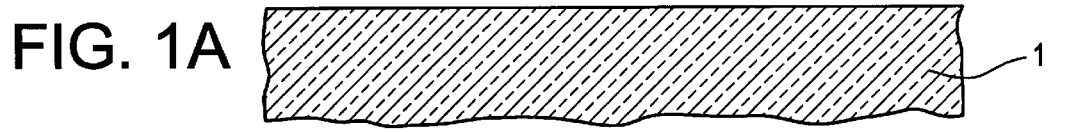
Figure 1B:
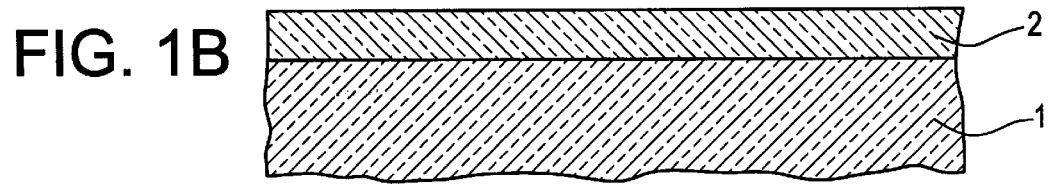

A light-transparent conductive layer 2 is formed on the substrate 1 (FIG. 1B).

The conductive layer 2 is formed of, for example, a tin oxide, or a light-transparent conductive material consisting principally of a tin oxide. The conductive layer 2 is formed by, for example, a known vacuum evaporation method to a thickness of, for instance, 0.1 to 0.2 μm.

Figure 1C:
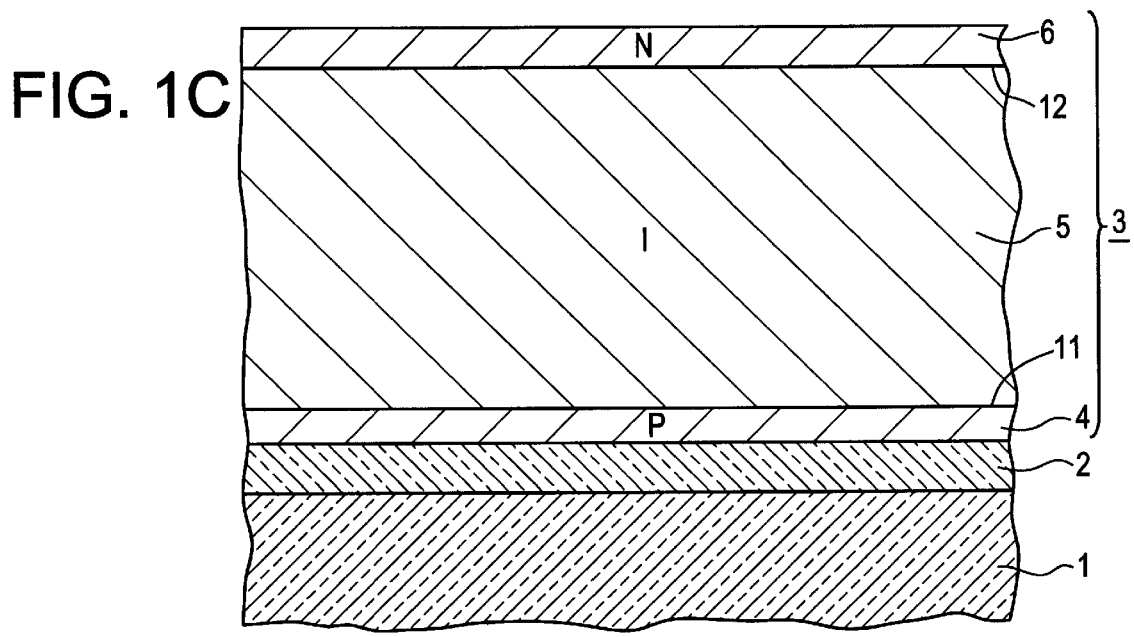

Next, a non-single-crystal semiconductor laminate member 3 is formed on the conductive layer 2 (FIG. 1C).

The non-single-crystal semiconductor laminate member 3 has such a structure that a P-type non-single-crystal semiconductor layer 4, an I-type non-single-crystal semiconductor layer 5 and an N-type non-single-crystal semiconductor layer 6 are sequentially formed in this order. These non-single-crystal semiconductor layers 4, 5 and 6 form PIN junction.

The non-single-crystal semiconductor layer 4 of the non-single-crystal semiconductor laminate member 3 is formed of, for example, Si, $Si_xC_{1-x}$ (where 0<x<1, for instance, x=0.8) or Ge in an amorphous, semi-amorphous, or microcrystalline form. The non-single-crystal semiconductor layer 4 is, for example, 100 angstroms thick.

The non-single-crystal semiconductor layer 4 is formed by a CVD method which employs a semiconductor material gas composed of a hydride or halide of a semiconductor, such as Si, $Si_x C_{1-x}$ (where 0<x<1), or Ge, and an impurity material gas composed of a hydride or halide of a P-type impurity, for instance, diborane ($B_2H_6$). The CVD method may or may not employ a glow discharge (plasma), or light. In this case, the non-single-crystal semiconductor layer 4 has a P-type impurity introduced therein (boron) in a concentration as high as $1\times10^{19}$ to $6\times10^{20}$ atoms/cm$^3$, as shown in FIG. 2B.

The non-single-crystal semiconductor layer 5 is formed of, for instance, amorphous or semi-amorphous silicon, and has a thickness of, for example, 0.3 to 0.8 μm, in particular, 0.5 μm.

The non-single-crystal semiconductor layer 5 is formed by a CVD method which uses a semiconductor raw material gas composed of a hydride or halide of silicon, for example, $Si_nH_{2n+2}$ (where n is greater than or equal to 1), or $SiF_m$ (where m is greater than or equal to 2), and a deposit impurity material gas composed of a hydride or halide of a P-type impurity, for instance, diborane ($B_2H_6$), the CVD method may employ or may not employ a glow discharge (plasma), or light. In this case, by decreasing the concentration of the deposit material gas relative to the concentration of the semiconductor raw material gas within a range of less than 5 ppm with the lapse of time, the non-single-crystal semiconductor layer 5 is formed having introduced thereinto a P-type impurity (boron), the concentration of which linearly and continuously decreases in the thickness direction of the layer towards the non-single-crystal semiconductor layer 6 as shown in FIG. 2B. The concentration of the P-type impurity in the non-single-crystal semiconductor layer 5 is high on the side of the non-single-crystal semiconductor layer 4 as compared with the impurity concentration on the side of the non-single-crystal semiconductor layer 6. The ratio of the impurity concentration in the layer 5 at one end thereof adjacent the layer 6 to the concentration at the other end adjacent the layer 4 is 1/10 to 1/100, preferably, 1/20 to 1/40. In practice, the P-type impurity (boron) has a concentration of $2\times10^{15}$ to $2\times10^{17}$ atoms/cm$^3$ at the end of the layer 5 adjacent the layer 4 and a concentration below $1\times10^{15}$ atoms/cm$^3$ at the end of the layer 5 adjacent the layer 6.

The non-single-crystal semiconductor layer 5 is formed by the above-said CVD method. In this case, the semiconductor raw material gas is one that is obtained by passing a semiconductor raw material gas through a molecular sieve or zeolite which adsorbs oxygen, and/or carbon and/or phosphorus. Accordingly, the non-single-crystal semiconductor layer 5 is formed to contain oxygen at a concentration less than $5\times10^{19}$ and as low as $5\times10^{18}$ atoms/cm$^3$, and/or carbon at a concentration less than $4\times10^{18}$ and as low as $4\times10^{15}$ atoms/cm$^3$, and/or phosphorus at a concentration at least as low as $5\times10^{15}$ atoms/cm$^3$.

The non-single-crystal semiconductor layer 6 is formed of, for instance, microcrystalline silicon, and has a thickness of, for example, 100 to 300 angstroms.

The non-single-crystal semiconductor layer 6 is formed by a CVD method which employs a semiconductor raw material gas composed of a hydride or halide of silicon, for example, $Si_nH_{2n+2}$ (where n is greater than or equal to 1) or $SiF_m$ (where m is greater than or equal to 2), and an impurity material gas composed of a hydride or halide of an N-type impurity, for instance, phosphine ($PH_3$). The CVD method may or may not employ a glow discharge (plasma) light. In this case, the non-single-crystal semiconductor layer 6 has an N-type impurity (phosphorus) introduced thereinto with a concentration of $1\times10^{19}$ to $6\times10^{20}$ atoms/cm$^3$, as shown in FIG. 2.

Figure 1D:
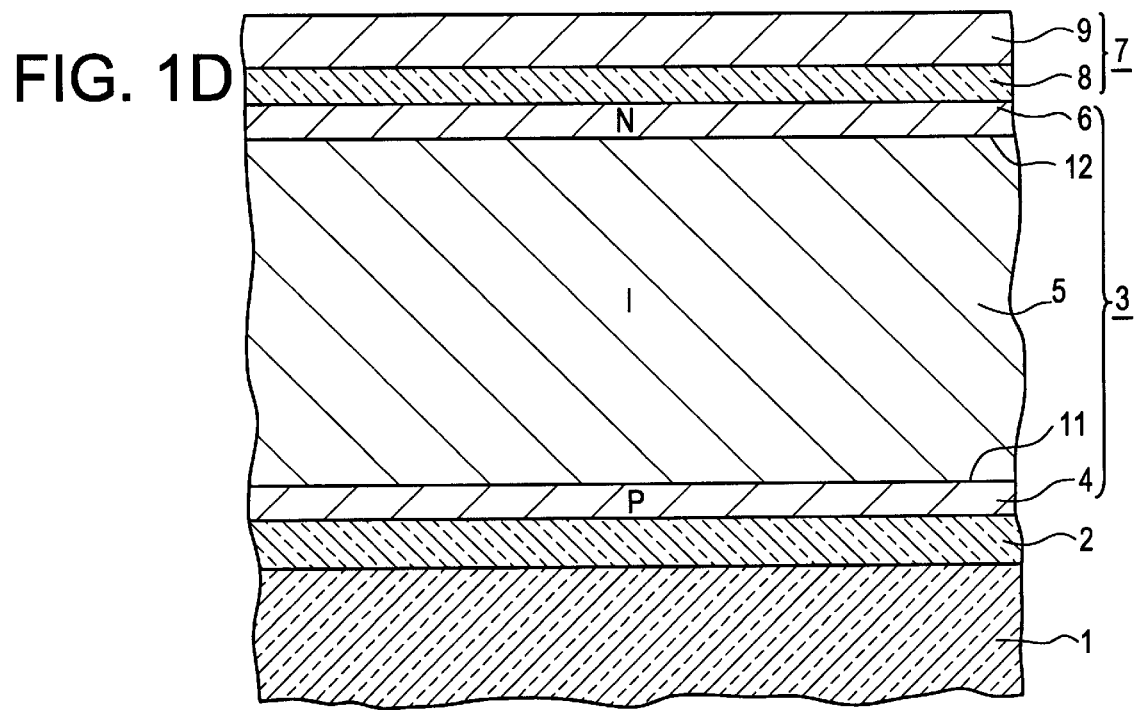

Next, a conductive layer 7 is formed on the non-single-crystal semiconductor laminate member 3 made up of the non-single-crystal semiconductor layers 4, 5 and 6, that is, on the non-single-crystal semiconductor layer 6 (FIG. 1D).

The conductive layer 7 has such a structure that a light-transparent conductive layer 8 formed of, for example, a tin oxide or a light-transparent conductive material consisting principally of tin oxide, and a reflective conductive layer 9 formed of a metal, such as aluminum, silver, or the like, are formed in this order. In this case, the conductive layer 8 is formed to a thickness of 900 to 1300 angstroms thick by means of, for example, vacuum evaporation, and the conductive layer 9 is also formed by vacuum evaporation.

Figure 2A:
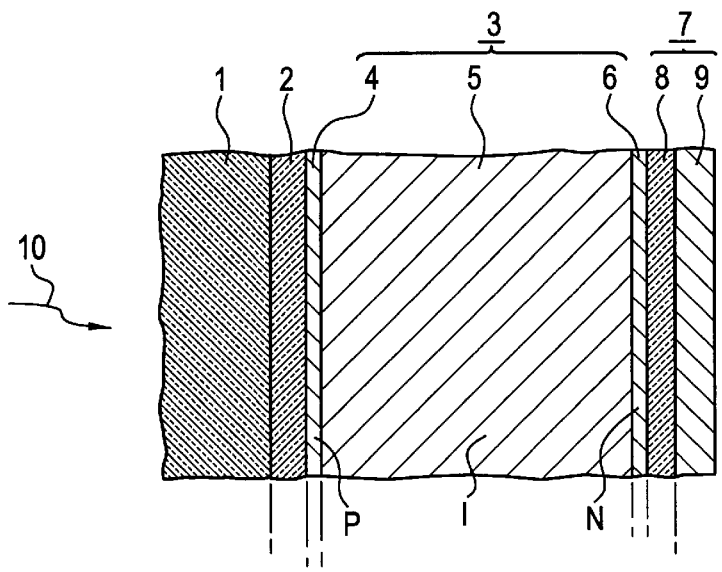
FIG. 2A is a sectional view schematically illustrating a first embodiment of the photoelectric conversion device by the manufacturing method shown in FIG. 1.
Figure 2B:
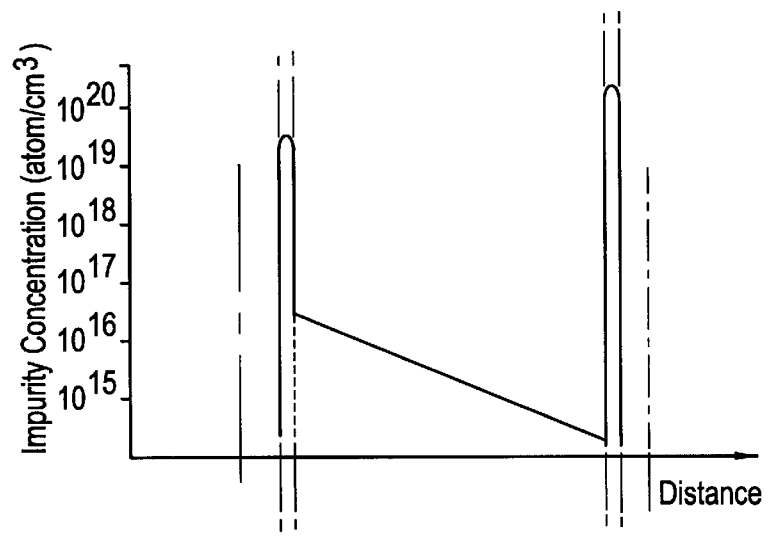
FIG. 2B is a graph showing the concentration distributions of impurities introduced into first, second, and third non-single-crystal semiconductor layers of the photoelectric conversion device depicted in FIG. 2A.

In the manner described above, the first embodiment of the photoelectric conversion device of the present invention shown in FIG. 2A is manufactured.

With the photoelectric conversion device shown in FIG. 2A, when light 10 is incident on the side of the substrate 1 towards the non-single-crystal semiconductor laminate member 3, electron-hole pairs are created in the I-type non-single-crystal semiconductor layer 5 in response to the light 10. The holes of the electron-hole pairs thus produced flow through the P-type non-single-crystal semiconductor layer 4 into the light-transparent conductive layer 2, and the electrons flow through the N-type non-single-crystal semiconductor layer 6 into the conductive layer 7. Therefore, photocurrent is supplied to a load which is connected between the conductive layers 2 and 7, thus providing the photoelectric conversion function.

In this case, the I-type non-single-crystal semiconductor layer 5 has a P-type impurity (boron) introduced thereinto which is distributed so that the impurity concentration continuously decreases towards the non-single-crystal semiconductor layer 6 in the thickness direction of the layer 5, as shown in FIG. 2B. On account of this, even if the I-type non-single-crystal semiconductor layer 5 is formed thick for generating therein a large quantity of electron-hole pairs in response to the incidence of light, a depletion layer (not shown) which extends into the non-single-crystal semiconductor layer 5 from the PI junction 11 between the P-type non-single-crystal semiconductor layer 4 and the I-type non-single-crystal semiconductor layer 5 and a depletion (not shown) layer which extends into the non-single-crystal semiconductor layer 5 from the NI junction 12 between the N-type non-single-crystal semiconductor layer 6 and the non-single-crystal semiconductor layer 5 are joined together. Therefore, the I-type non-single-crystal semiconductor layer 5, as viewed from the bottom of the conduction band and the top of the valence bands of its energy band, has a gradient that effectively causes holes and electrons to drift towards the non-single-crystal semiconductor layers 4 and 6, respectively.

Accordingly, the photoelectric conversion device of the present invention, shown in FIG. 2A, achieves a higher photoelectric conversion efficiency than the conventional photoelectric conversion devices.

Figure 3:
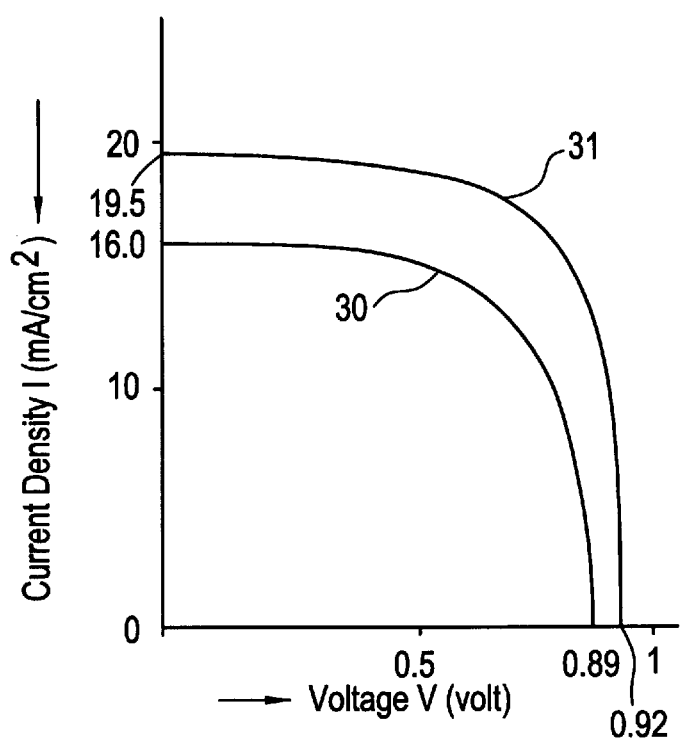
FIG. 3 is a graph showing the voltage V (volt)- current density I (mA/cm$^2$) characteristic of the photoelectric conversion device of FIG. 2, in comparison with the characteristic of a conventional photoelectric conversion device.

By the way, according to a photoelectric conversion device corresponding to the conventional one and which is identical in construction with the photoelectric conversion device of the present invention shown in FIG. 2A, except that the concentration of the N-type impurity in the I-type non-single-crystal semiconductor layer 5 is about $10^{16}$ atoms/cm$^3$ which is far lower than the impurity concentrations in the P-type and N-type non-single-crystal semiconductor layers 4 and 6 because the I-type non-single-crystal semiconductor layer 5 is formed to contain oxygen, and/or carbon, and/or phosphorus in large quantities, as referred to previously, provided a voltage V (volt)-current density I (mA/cm$^2$) characteristic as indicated by a curve 30 in FIG. 3. Accordingly, the open-circuit voltage was 0.89 V, the short-circuit current density I was 16.0 mA/cm$^2$, the fill factor was 61%, and the photoelectric conversion efficiency about 8.7%. In contrast thereto, the photoelectric conversion device of the present invention shown in FIG. 2A, provided the voltage V -current density I characteristic as indicated by curve 31 in FIG. 3. Accordingly, the open-circuit voltage V was 0.92 V, which is higher than was obtained with the above-said device corresponding to the prior art device; the current density I was 19.5 mA/cm$^2$; the fill factor was 68%; and the photoelectric conversion efficiency was about 12.2%. Incidentally, these results were obtained under the conditions wherein a photoelectric conversion devices, each having the non-single-crystal semiconductor laminate member 3 of a 1.05 cm$^2$ area, were exposed to irradiation by light with an intensity of AM1 (100 mW/cm$^2$).

In the case of the photoelectric conversion device of the present invention shown in FIG. 2A, since the I-type non-single-crystal semiconductor layer 5 has boron introduced thereinto as a P-type impurity the boron combines with the oxygen and/or carbon and/or phosphorus contained in the non-single-crystal semiconductor layer 5. In addition, the concentration of the P-type impurity (boron) is high on the side of the PI junction 11, that is, on the side of the P-type non-single-crystal semiconductor layer 4. Accordingly, the expansion of the depletion layer extending into the I-type non-single-crystal semiconductor layer 5 from the PI junction 11 between the P-type non-single-crystal semiconductor layer 4 and the I-type non-single-crystal semiconductor layer 5 is hardly or only slightly diminished by the light irradiation effect (the Staebler-Wronski effect).

For this reason, according to the photoelectric conversion device of the present invention, the aforesaid high photoelectric conversion efficiency is hardly impaired by long-term use.

Figure 4:
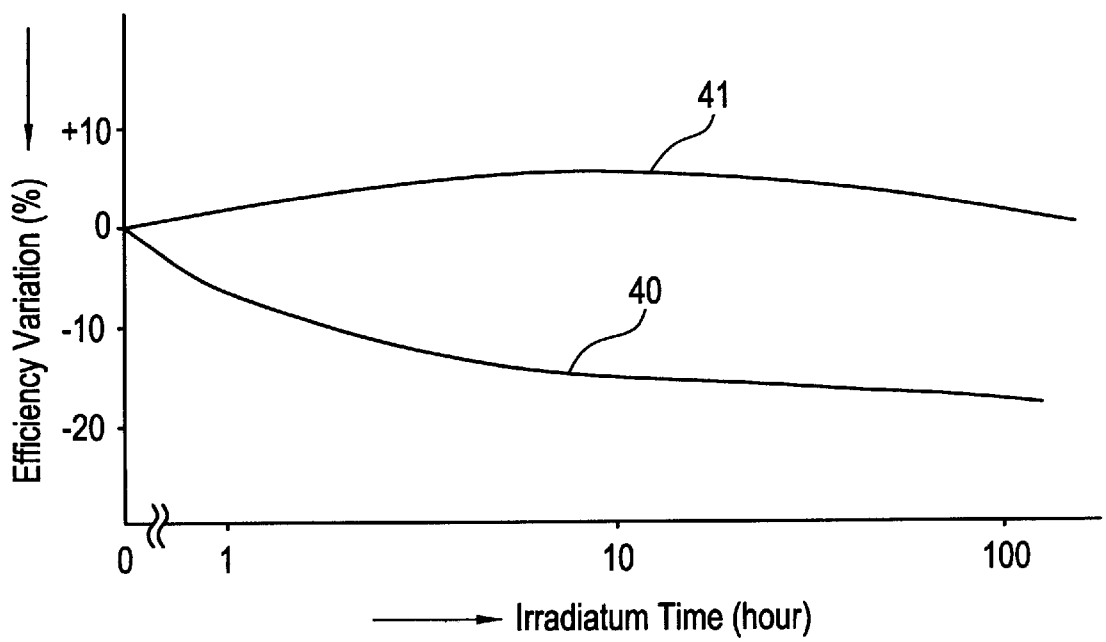
FIG. 4 is a graph showing variations (%) in the photoelectric conversion efficiency of the photoelectric conversion device of the present invention, shown in FIG. 2, in comparison with a conventional photoelectric conversion device.

In addition, the aforesaid photoelectric conversion device corresponding to the prior art one which provided the voltage V-current density I characteristic indicated by the curve 30 in FIG. 3 exhibited, variations (%) in the photoelectric conversion efficiency relative to the light irradiation time T (hr) as indicated by curve 40 in FIG. 4. In contrast thereto, in the case of the photoelectric conversion device of the present invention, the photoelectric conversion efficiency varied with the light irradiation time T as indicated by curve 41 in FIG. 4. That is, the photoelectric conversion efficiency slightly increased in an early stage and, thereafter, it decreased only very slightly with time. These result were also obtained under the same conditions mentioned previously in connection with FIG. 3.

As described above, the first embodiment of the photoelectric conversion device of the present invention possesses the advantage that it provides a high photoelectric conversion efficiency than the conventional photoelectric conversion devices, even when used for a long period of time.

Further, the manufacturing method of the present invention shown in FIG. 1 employs a series of simple steps such as forming the conductive layer 2 on the substrate 1, forming the non-single-crystal semiconductor layers 4, 5 and 6 on the conductive layer 2 through the CVD method to provide the non-single-crystal semiconductor laminate member 3 and forming a conductor layer 7 on the non-single-crystal semiconductor laminate member 3. The I-type non-single-crystal semiconductor layer 5 is formed by the CVD method using a semiconductor raw material gas and a P-type deposit (boron) gas and, in this case, simply by continuously changing the concentration of the deposit material gas relative to the concentration of the semiconductor raw material gas as a function of time, the P-type impurity is introduced into the layer 5 with such a concentration distribution that its concentration continuously decreases towards the non-single-crystal semiconductor layer 6 in the thickness direction of the layer 5.

Accordingly, the manufacturing method of the present invention allows ease in the fabrication of the photoelectric conversion device of the present invention which has the aforementioned advantages.

Figure 2C:
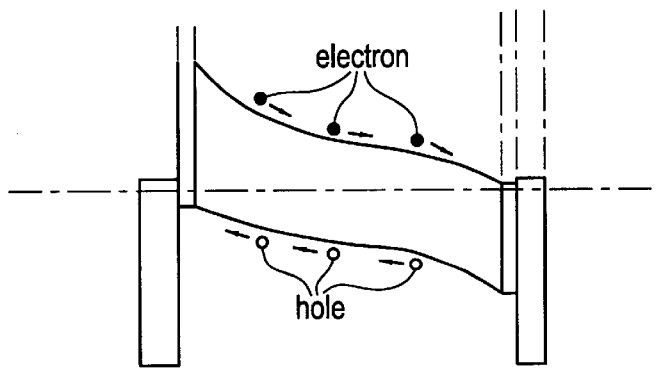
FIG. 2C is a graph showing the energy band of the photoelectric conversion device shown in FIG. 2A.

Incidentally, the first embodiment illustrated in FIG. 2 shows the case in which the impurity contained in the I-type non-single-crystal semiconductor layer 5 has such a concentration distribution as shown in FIG. 2B in which the concentration linearly and continuously drops towards the non-single-crystal semiconductor layer 6.

Figure 5A:
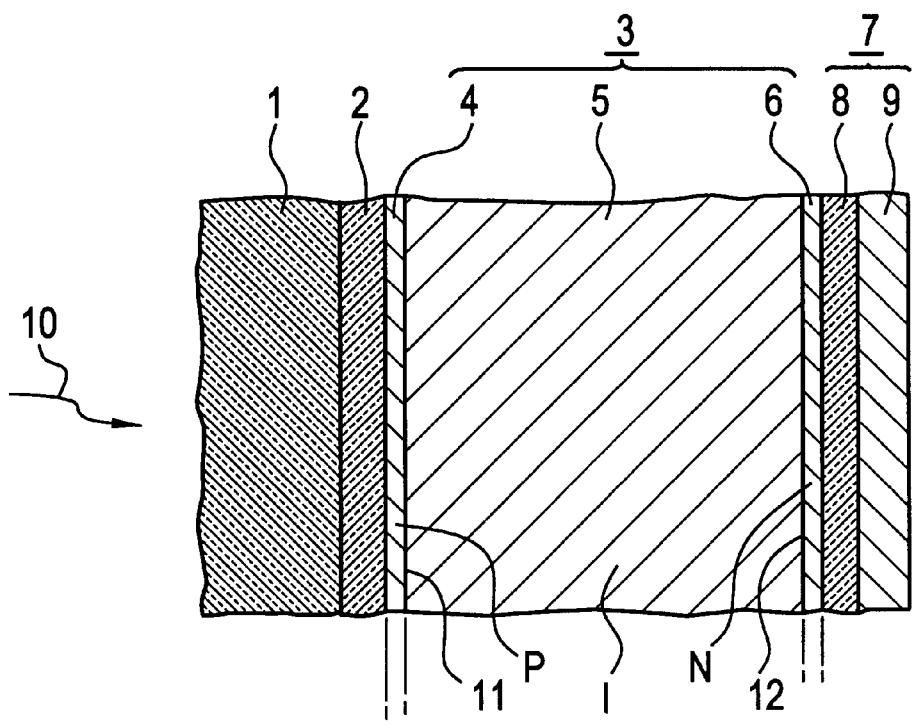
FIG. 5A is a sectional view schematically illustrating a second embodiment of the photoelectric conversion device of the present invention.
Figure 5B:
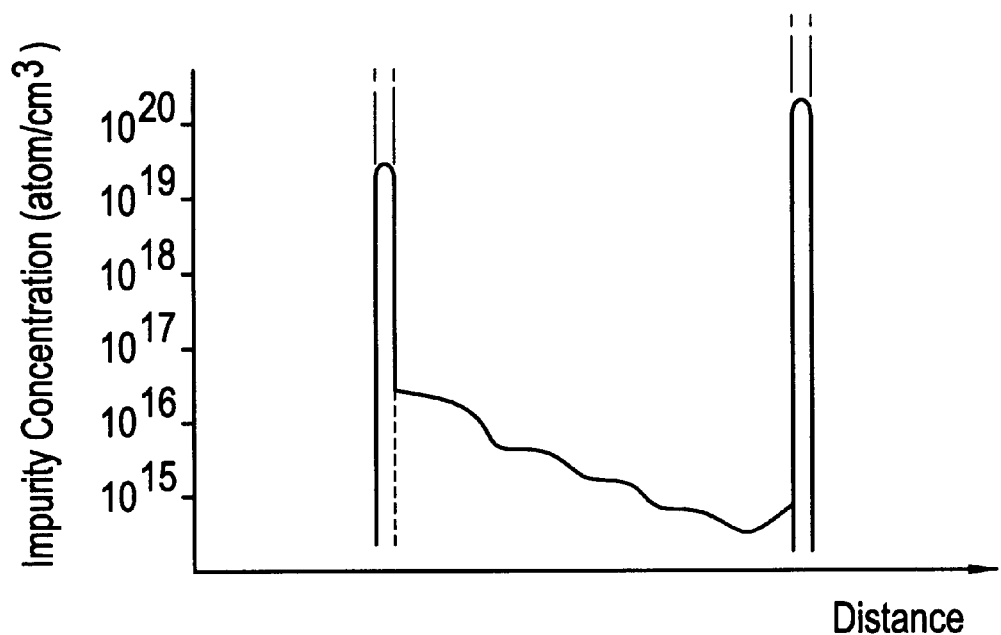
FIG. 5B is a graph showing concentration distributions of impurities introduced into first, second, and third non-single-crystal semiconductor layers of the second embodiment of the present invention.
Figure 6A:
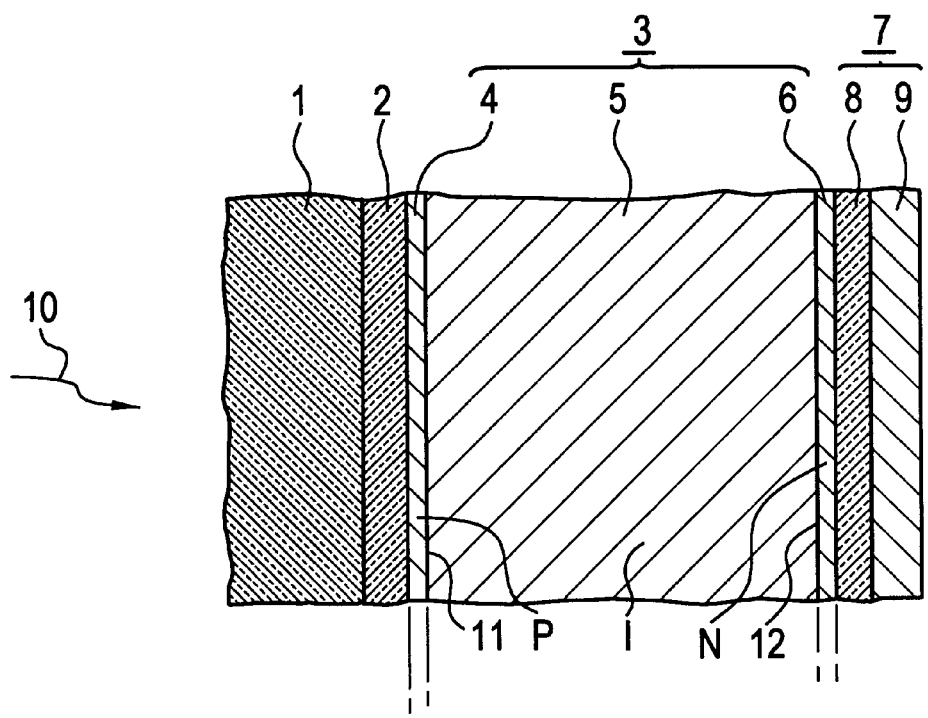
FIG. 6A is a sectional view schematically illustrating a third embodiment of the photoelectric conversion device of the present invention.
Figure 6B:
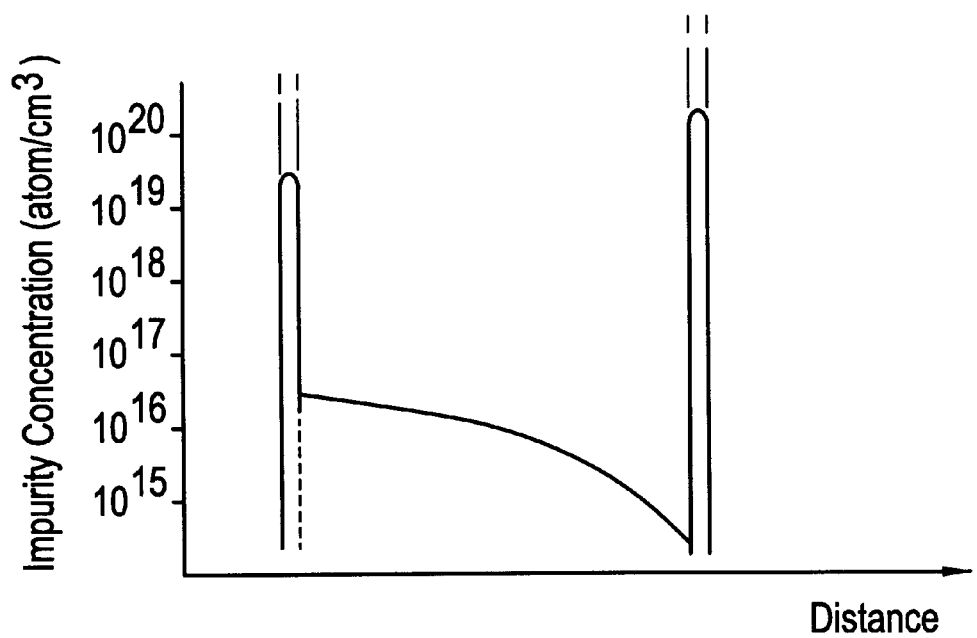
FIG. 6B is a graph showing the concentration distributions of impurities introduced into first, second, and third non-single-crystal semiconductor layers of the photoelectric conversion device shown in FIG. 6A.

As will be appreciated from the above, however, even if the impurity introduced in the I-type non-single-crystal semiconductor layer 5 has a concentration profile such that the impurity concentration drops stepwise and continuously towards the non-single-crystal semiconductor layer 6 as shown in FIG. 5B which illustrates a second embodiment of the present invention, and even if the impurity in the layer 5 has such a concentration distribution that the impurity concentration decreases non-linearly and continuously towards the layer 6 in a manner to obtain a concentration distribution such that the impurity concentration abruptly drops in the end portion of the layer 5 adjacent the layer 6 as shown in FIG. 6 which illustrates a third embodiment of the present invention, the photoelectric conversion device of the present invention produces the same excellent operation and effects as are obtainable with the photoelectric conversion device shown in FIG. 2.

Further, the foregoing description has been given of the case where light is incident on the photoelectric conversion device from the side of the substrate 1 and, accordingly, the non-single-crystal semiconductor layer 4 of the non-single-crystal semiconductor laminate member 3 on the side on which the light is incident is P-type.

But, also in case where the photoelectric conversion device is arranged to be exposed to light on the side opposite from the substrate 1, the non-single-crystal semiconductor layer 6 of the non-single-crystal semiconductor laminate member 3 on the side of the incidence of light is P-type, the non-single-crystal semiconductor layer 4 on the side of the substrate 1 is N-type and the non-single-crystal semiconductor layer 5 has introduced thereinto a P-type impurity (boron) which is distributed so that the impurity concentration continuously decreases towards the non-single-crystal semiconductor layer 4 in the thickness direction of the layer 5, the same excellent operation and effects as described previously can be obtained, as will be understood from the foregoing description. In this case, however, the conductive layer 7 must be substituted with a light-transparent one. The substrate 1 and the conductive layer 2 need not be light-transparent.

While in the foregoing the non-single-crystal semiconductor laminate member 3 has one PIN junction, it is also possible to make the laminate member 3 have two or more PIN junctions and to form each of the two or more I-type non-single-crystal semiconductor layers so that the P-type impurity introduced therein may have the aforesaid concentration distribution.

It will be apparent that many modifications and variations may be effected without departing from the scope of the novel concepts of the present invention.

What is claimed is:

1. A semiconductor device comprising:
a substrate; and
a non-single crystalline semiconductor layer formed over said substrate, said semiconductor layer comprising amorphous silicon and including at least hydrogen; and
at least one intrinsic or substantially intrinsic region formed within said semiconductor layer;
at least one N-type or P-type region formed within said semiconductor layer; and
at least one NI or PI junction between said intrinsic or substantially intrinsic region and said N-type or P-type region,
wherein carbon is present in said intrinsic or substantially intrinsic region and the concentration of said carbon is less than $4 \times 10^{18}$ atoms/cm$^3$ and not lower than $4 \times 10^{15}$ atoms/cm$^3$.

2. The semiconductor device of claim 1 wherein said concentration of said carbon is not lower than $4 \times 10^{15}$ atoms/cm$^3$.

3. A semiconductor device according to claim 1 wherein said intrinsic or substantially intrinsic region is formed by a chemical vapor deposition.

4. A semiconductor device comprising:
a substrate; and
a non-single crystalline semiconductor layer formed over said substrate, said semiconductor layer comprising silicon and including at least hydrogen; and
at least one intrinsic or substantially intrinsic region formed within said semiconductor layer;
at least one N-type or P-type region formed within said semiconductor; and
at least one NI or PI junction between said intrinsic or substantially intrinsic region and said N-type or P-type region, wherein carbon is present in said intrinsic or substantially intrinsic region and the concentration of said carbon is less than $4 \times 10^{18}$ atoms/cm$^3$ and not lower than $4 \times 10^{15}$ atoms/cm$^3$.

5. The semiconductor device of claims 1 or 4, wherein a concentration of boron in said intrinsic or substantially intrinsic region is not higher than $2 \times 10^{17}$ atoms/cm$^3$.

6. The semiconductor device of claims 1 or 4, wherein a concentration of phosphor us in said N-type region is higher than $1 \times 10^{19}$ atoms/cm$^3$.

7. The semiconductor device of claims 1 or 4 wherein said N-type region comprises microcrystalline silicon.

8. The semiconductor device of claims 1 or 4, wherein said intrinsic or substantially intrinsic region has a thickness of 0.5 $\mu$m.

9. A semiconductor device according to claim 4 wherein said intrinsic or substantially intrinsic region is formed by a chemical vapor deposition.

10. A semiconductor device comprising:
a substrate; and
an amorphous semiconductor layer of intrinsic or substantially intrinsic conductivity type formed over said substrate, said semiconductor layer comprising silicon and including at least hydrogen; and
at least one NI or PI junction formed with said amorphous semiconductor layer,
wherein carbon is present in said semiconductor layer and the concentration of said carbon is less than $4 \times 10^{18}$ atoms/cm$^3$ and not lower than $4 \times 10^{15}$ atoms/cm$^3$.

11. The semiconductor device of claim 10, wherein a concentration of boron in said semiconductor layer is not higher than $2 \times 10^{17}$ atoms/cm$^3$.

12. The semiconductor device of claim 10, further comprising an N-type semiconductor layer in contact with said amorphous semiconductor layer to form said NI junction therebetween, wherein a concentration of phosphorus in the N-type layer is higher than $1 \times 10^{19}$ atoms/cm$^3$.

13. The semiconductor device of claim 10, where said semiconductor layer has a thickness of 0.5 $\mu$m.

14. A semiconductor device comprising:
a substrate; and
an amorphous semiconductor layer of intrinsic or substantially intrinsic conductivity type formed over said substrate, said semiconductor layer comprising silicon and including at least hydrogen; and
an N-type microcrystalline semiconductor layer comprising silicon in contact with said amorphous semiconductor layer to form at least one NI or PI junction,
wherein carbon is present in said semiconductor layer and the concentration of said carbon is less than $4 \times 10^{18}$ atoms/cm$^3$ and not lower than $4 \times 10^{15}$ atoms/cm$^3$.

15. A semiconductor device according to claim 10 wherein said amorphous semiconductor layer is formed by a chemical vapor deposition.

16. A non-single-crystalline semiconductor material comprising silicon having at least one junction formed between a substantially intrinsic or intrinsic semiconductor material and a one conductivity type semiconductor material, said junction being one of NI and PI junctions, said semiconductor material containing at least hydrogen and wherein carbon is present in said substantially intrinsic or intrinsic semiconductor material in an amount less than $4 \times 10^{18}$ atoms/cm$^3$ and not lower than $4 \times 10^{15}$ atoms/cm$^3$.

17. A non-single crystalline semiconductor material according to claim 16 wherein said substantially intrinsic or intrinsic semiconductor material is formed by a chemical vapor deposition.

18. An amorphous semiconductor material comprising silicon having at least one junction formed between a substantially intrinsic or intrinsic semiconductor material and a one conductivity type semiconductor material, said junction being one of NI and PI junctions, said semiconductor material containing at least hydrogen and wherein carbon is present in said substantially intrinsic or intrinsic semiconductor material in an amount less than $4 \times 10^{18}$ atoms/cm$^3$ and not lower than $4 \times 10^{15}$ atoms/cm$^3$.

19. The semiconductor material of claims 16 or 18, wherein the concentration of boron contained in said substantially intrinsic or intrinsic semiconductor material is not higher than $2 \times 10^{17}$ atoms/cm$^3$.

20. The semiconductor material of claims 16 or 18, further comprising an N-type semiconductor layer in contact with said amorphous semiconductor layer to form said NI junction therebetween, wherein a concentration of phosphorus in the N-type layer is higher than $1 \times 10^{19}$ atoms/cm$^3$.

21. The semiconductor material of claims 16 or 18, further comprising an N-type semiconductor layer in contact with said amorphous semiconductor layer to form said NI junction therebetween, wherein the N-type layer comprises microcrystalline silicon.

22. The semiconductor material of claims 16 or 18, wherein said substantially intrinsic or intrinsic semiconductor material has a thickness of 0.5 $\mu$m.

23. An amorphous semiconductor material according to claim 18 wherein said substantially intrinsic or intrinsic semiconductor material is formed by a chemical vapor deposition.

24. A semiconductor device comprising:
a substrate; and
a non-single crystalline semiconductor layer formed over said substrate, said semiconductor layer comprising silicon and including at least hydrogen; and
at least one intrinsic or substantially intrinsic region formed within said semiconductor layer;
at least one N-type or P-type region formed within said semiconductor layer; and
at least one NI or PI junction between said intrinsic or substantially intrinsic region and said N-type or P-type region,
wherein carbon is present in said intrinsic or substantially intrinsic region and the concentration of said carbon is less than $4 \times 10^{18}$ atoms/cm$^3$ and not lower than $4 \times 10^{15}$ atoms/cm$^3$, and at least a portion of said intrinsic or substantially intrinsic region contains boron in a concentration $1 \times 10^{15}$ to $2 \times 10^{17}$.

25. A semiconductor device according to claim 24 wherein said intrinsic or substantially intrinsic region is formed by a chemical vapor deposition.

26. A semiconductor device comprising:
a substrate; and
a non-single crystalline semiconductor layer of intrinsic or substantially intrinsic conductivity type formed over said substrate, said semiconductor layer comprising silicon and including at least hydrogen; and
at least one NI or PI junction formed with said non-single crystalline semiconductor layer,
wherein carbon is present in said intrinsic or substantially intrinsic region and the concentration of said carbon is less than $4 \times 10^{18}$ atoms/cm$^3$ and not lower than $4 \times 10^5$ atoms/cm$^3$, and at least a portion of said intrinsic or substantially intrinsic region contains boron in a concentration $1 \times 10^{15}$ to $2 \times 10^{17}$.

27. A semiconductor device according to claim 26 wherein said non-single crystalline semiconductor layer is formed by a chemical vapor deposition.

28. A semiconductor device comprising:
a substrate; and
a non-single crystalline semiconductor layer formed over said substrate, said semiconductor layer comprising amorphous silicon including at least hydrogen; and
at least one N-type or P-type region formed within said semiconductor layer;
at least one second region formed within said semiconductor layer, said second region having a different conductivity type from said at least one N-type or P-type region;
at least one junction between said N-type or P-type region and said second region,
wherein carbon is present in said second region and the concentration of said carbon is less than $4 \times 10^{18}$ atoms/cm$^3$ and not lower than $4 \times 10^{15}$ atoms/cm$^3$.

29. A semiconductor device according to claim 28 wherein said second region is formed by a chemical vapor deposition.

30. A semiconductor device comprising:
a substrate; and
an amorphous semiconductor layer formed over said substrate, said semiconductor layer comprising silicon and including at least hydrogen; and
at least one junction formed with said amorphous semiconductor layer,
wherein carbon is present in said semiconductor layer and the concentration of said carbon is less than $4 \times 10^{18}$ atoms/cm$^3$ and not lower than $4 \times 10^{15}$ atoms/cm$^3$.

31. A semiconductor device according to claim 30 wherein said amorphous semiconductor layer is formed by a chemical vapor deposition.

32. A semiconductor device comprising:
a substrate; and
an amorphous semiconductor layer formed over said substrate, said semiconductor layer comprising silicon and including at least hydrogen; and
an N-type semiconductor layer comprising silicon in contact with said amorphous semiconductor layer to form at least one junction,
wherein carbon is present in said semiconductor layer and the concentration of said carbon is less than $4 \times 10^{18}$ atoms/cm$^3$ and not lower than $4 \times 10^{15}$ atoms/cm$^3$.

33. A semiconductor device according to claim 32 wherein said amorphous semiconductor layer is formed by a chemical vapor deposition.

34. An amorphous semiconductor material comprising silicon having at least one junction formed between a first semiconductor material and a second semiconductor material having a different conductivity type from said first semiconductor material, said first semiconductor material containing at least hydrogen and wherein carbon is present in said first semiconductor material in an amount less than $4\times10^{18}$ atoms/cm$^3$ and not lower than $4\times10^{15}$ atoms/cm$^3$.

35. An amorphous semiconductor material according to claim 34 wherein said first semiconductor material is formed by a chemical vapor deposition.

* * * * *